(12) United States Patent
Lee et al.

(10) Patent No.: US 11,145,520 B2
(45) Date of Patent: Oct. 12, 2021

(54) METHOD FOR TREATING SUBSTRATE INVOLVING SUPPLYING TREATMENT LIQUID TO PERIPHERAL AREA OF SUBSTRATE BY SECOND NOZZLE

(71) Applicant: SEMES CO., LTD., Chungcheongnam-do (KR)

(72) Inventors: Young Hun Lee, Chungcheongnam-do (KR); Eui Sang Lim, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 16/916,246

(22) Filed: Jun. 30, 2020

(65) Prior Publication Data

US 2020/0335364 A1  Oct. 22, 2020

Related U.S. Application Data

(62) Division of application No. 15/604,267, filed on May 24, 2017, now abandoned.

(30) Foreign Application Priority Data

May 27, 2016  (KR) .................. 10-2016-0065859

(51) Int. Cl.
*B08B 3/02* (2006.01)
*H01L 21/67* (2006.01)

(52) U.S. Cl.
CPC ........ *H01L 21/67051* (2013.01); *B08B 3/024* (2013.01); *B08B 2203/0229* (2013.01)

(58) Field of Classification Search
CPC ... B08B 2203/0229; B08B 3/024; B08B 3/08; B08B 3/10; H01L 21/67051; H01L 21/02052; H01L 21/67017; H01L 21/67126; H01L 21/6715
See application file for complete search history.

(56) References Cited

U.S. PATENT DOCUMENTS

| | | | |
|---|---|---|---|
| 2007/0137677 A1* | 6/2007 | Nanba ............... | H01L 21/67051 134/33 |
| 2009/0033898 A1* | 2/2009 | Yamamoto .......... | H01L 21/6715 355/53 |
| 2014/0261570 A1* | 9/2014 | Orii ................... | H01L 21/02052 134/31 |
| 2015/0147888 A1* | 5/2015 | Nonaka ............... | H01L 21/6708 438/748 |

(Continued)

FOREIGN PATENT DOCUMENTS

| | | |
|---|---|---|
| CN | 104103496 A | 10/2014 |
| TW | 200738358 A | 10/2007 |
| TW | 200916983 A | 4/2009 |

(Continued)

*Primary Examiner* — Douglas Lee
(74) *Attorney, Agent, or Firm* — Li & Cai Intellectual Property (USA) Office

(57) ABSTRACT

Disclosed is a method for liquid-treating a substrate. In a method for treating a substrate, the substrate may be treated by supplying a treatment liquid onto the rotating substrate by using a first nozzle and a second nozzle, the first nozzle supplies the treatment liquid to an area including a central area on the substrate, and the second nozzle supplies the treatment liquid to a peripheral area of the substrate.

12 Claims, 13 Drawing Sheets

(56) References Cited

U.S. PATENT DOCUMENTS

2015/0159276 A1\* 6/2015 Kaneko ............... C23C 18/1675
427/261

FOREIGN PATENT DOCUMENTS

| TW | 201535561 A | 9/2015 |
| TW | 201541500 A | 11/2015 |
| WO | WO 2015-053329 A1 | 4/2015 |

\* cited by examiner

PRIOR ART

PRIOR ART

METHOD FOR TREATING SUBSTRATE INVOLVING SUPPLYING TREATMENT LIQUID TO PERIPHERAL AREA OF SUBSTRATE BY SECOND NOZZLE

CROSS-REFERENCE TO RELATED APPLICATIONS

A claim for priority under 35 U.S.C. § 119 is made to Korean Patent Application No. 10-2016-0065859 filed May 27, 2016, in the Korean Intellectual Property Office, the entire contents of which are hereby incorporated by reference.

BACKGROUND

The inventive concept relates to an apparatus and a method for treating a substrate.

Contaminants such as particles, organic contaminants, and metallic contaminants on a surface of a substrate greatly influence the characteristics and yield rate of a semiconductor device. Due to this, a cleaning process of removing various contaminants attached to a surface of a substrate is very important, and a process of cleaning a substrate is performed before and after unit processes for manufacturing a semiconductor. In general, a process of cleaning a substrate includes a chemical treating process of removing metallic substances, organic substances, and particles residing on a substrate by using a treatment liquid such as a chemical, a rinsing process of removing the chemical residing on the substrate by using pure water, and a drying process of drying the substrate by using an organic solvent, a supercritical fluid, or a nitrogen gas.

FIG. 1 is a view illustrating a supporting unit that supports a substrate and a liquid supply unit that supplies a liquid of a general substrate treating apparatus. FIG. 2 is a view illustrating the substrate of FIG. 1, to which the liquid is supplied, when viewed from the top. Referring to FIGS. 1 and 2, in general, when an organic solvent 32 is supplied onto the substrate 31 to dry the substrate, the liquid supply unit 33 discharges the organic solvent 32 to the substrate 31 supported by the substrate support unit 34 while the substrate 31 is rotated. In this case, fingerings are caused by a centrifugal force of the substrate 31 in a process in which the organic solvent 32 is applied to the whole substrate 31. As a time period until the organic solvent 32 is applied becomes longer, areas between the fingerings 35 are dried so that a surface of the substrate 31 is exposed. Further, when a rinsing process is performed by using pure water 36 before the organic solvent 32 is supplied, an area 37 in which the pure water 36 is dried is generated between the organic solvent 32 diffused on the substrate 31 and the pure water 36 that is preliminarily supplied, by humid heat between the organic solvent 32 and the substrate 31 and a difference between the surface tensions of the pure water 36 and the organic solvent 32. As the surface of the substrate 31 is exposed by the drying phenomenon, the surface of the substrate 31 may be contaminated by particles or a leaning phenomenon may occur in a pattern of the substrate 31.

SUMMARY

The inventive concept provides an apparatus and a method for minimizing a drying area generation time of a substrate when a liquid is supplied.

The inventive concept also provides an apparatus and a method for preventing contamination of a substrate due to particles.

The inventive concept also provides an apparatus and a method for preventing a leaning phenomenon of a substrate.

The problems that are to be solved by the inventive concept are not limited to the above-mentioned problems, and the unmentioned problems will be clearly understood by those skilled in the art to which the inventive concept pertains from the specification and the accompanying drawings.

The inventive concept provides a method for treating a substrate. In a method for treating a substrate, the substrate may be treated by supplying a treatment liquid onto the rotating substrate by using a first nozzle and a second nozzle, the first nozzle may supply the treatment liquid to an area including a central area on the substrate, and the second nozzle may supply the treatment liquid to a peripheral area of the substrate.

The method includes a first supply operation of supplying the treatment liquid onto the substrate by using the first nozzle and supplying the treatment liquid to the peripheral area by using the second nozzle at the same time, and thereafter, a second supply operation of supplying the treatment liquid by using the first nozzle and stopping supply of the treatment liquid by using the second nozzle.

In the first supply operation, the first nozzle may supply the treatment liquid while moving a first supply point that is a supply point of the treatment liquid supplied from the first nozzle on the substrate.

In the first supply operation, the second nozzle may supply the treatment liquid such that a second supply point that is a supply point of the treatment liquid supplied from the second nozzle on the substrate is fixed to a first location of the peripheral area.

In the first supply operation, the first nozzle may supply the treatment liquid while the first supply point moves between the central area and the peripheral area of the substrate.

The first supply operation may be performed while the treatment liquid is supplied while the first supply point moves from the center of the substrate to the first location once.

In the second supply operation, immediately after the first supply operation is performed, the first nozzle may supply the treatment liquid while the first supply point moves from the first location to an end of the substrate.

The first supply operation may be performed while the first supply point moves from the central area to the peripheral area once.

The first supply operation may be performed while the first supply point reciprocates between the central area and the peripheral area once.

Unlike this, in the first supply operation, the second nozzle may supply the treatment liquid while a second supply point that is a supply point of the treatment liquid supplied from the second nozzle on the substrate moves between the second location and the third location of the peripheral area, and. the second location may be a location that is closer to the central area of the substrate than the third location.

In the first supply operation, the first nozzle may supply the treatment liquid while the first supply point moves between the central area and the peripheral area of the substrate.

The first supply operation may be performed while the first supply point moves from the central area to the peripheral area once.

The first supply operation may be performed while the first supply point reciprocates between the central area and the peripheral area once.

In the second supply operation, the first nozzle may discharge the treatment liquid while the first supply point is fixed to the central area after the treatment liquid is supplied while the first supply point is moved.

The method may further include, before the first supply operation, a pre-wet operation of supplying a pre-wet liquid onto the substrate.

The pre-wet liquid may be pure water (DIW).

In the first supply operation and the second supply operation, the substrate may be rotated at 200 to 800 rpms.

In the first supply operation and the second supply operation, a time period for which the first supply point moves from the central area to the peripheral area once and a time period for which the first supply point moves from the peripheral area to the central area once may be 1.0 to 1.2 seconds.

The treatment liquid may be an organic solvent including isopropyl alcohol (IPA).

The substrate may be a wafer having a diameter of 300 mm, and the first location may be a location that is spaced apart from the center of the wafer by 140 mm.

The inventive concept provides an apparatus for treating a substrate. An apparatus for treating a substrate includes a housing that provides a space for performing a substrate treating process therein, a support unit that supports the substrate within the housing and rotates the substrate, a first nozzle that supplies a treatment liquid to an area including a central area on the substrate positioned on the support unit, a second nozzle that supplies a treatment liquid to a peripheral area on the substrate positioned on the support unit, and a controller that controls the first nozzle and the second nozzle.

The controller may control the first nozzle and the second nozzle such that a first supply operation of supplying the treatment liquid onto the substrate by using the first nozzle and supplying the treatment liquid to the peripheral area by using the second nozzle at the same time, and a second supply operation of, thereafter, supplying the treatment liquid by using the first nozzle and stopping supply of the treatment liquid by using the second nozzle are sequentially performed.

In the first supply operation, the controller may control the first nozzle such that the treatment liquid is supplied while a first supply point that is a supply point of the treatment liquid supplied from the first nozzle on the substrate is moved.

In the first supply operation, the controller may control the second nozzle such that a second supply point that is a supply point of the treatment liquid supplied from the second nozzle on the substrate is fixed to a first location of the peripheral area.

In the first supply operation may be performed while the treatment liquid is supplied while the first supply point moves from the center of the substrate to the first location once.

The controller may control the first nozzle such that in the second supply operation, immediately after the first supply operation is performed, the treatment liquid is supplied while the first supply point moves from the first location to an end of the substrate.

The first supply operation may be performed while the first supply point moves from the central area to the peripheral area once.

In the first supply operation, the controller may control the second nozzle such that a second supply point that is a supply point of the treatment liquid supplied from the second nozzle on the substrate moves between the second location and the third location of the peripheral area, and the second location may be a location that is closer to the central area of the substrate than the third location.

The treatment liquid may be an organic solvent.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for those skilled in the art more completely. Accordingly, the shapes of the components of the drawings are exaggerated to emphasize clearer description thereof.

In an embodiment of the inventive concept, a substrate treating apparatus for performing a process of cleaning a substrate will be described. However, the inventive concept is not limited thereto, but may be applied to various types of apparatuses that apply a liquid onto a substrate.

Hereinafter, examples of the apparatus and the method of the inventive concept will be described in detail with reference to the accompanying drawings.

Figure 3:
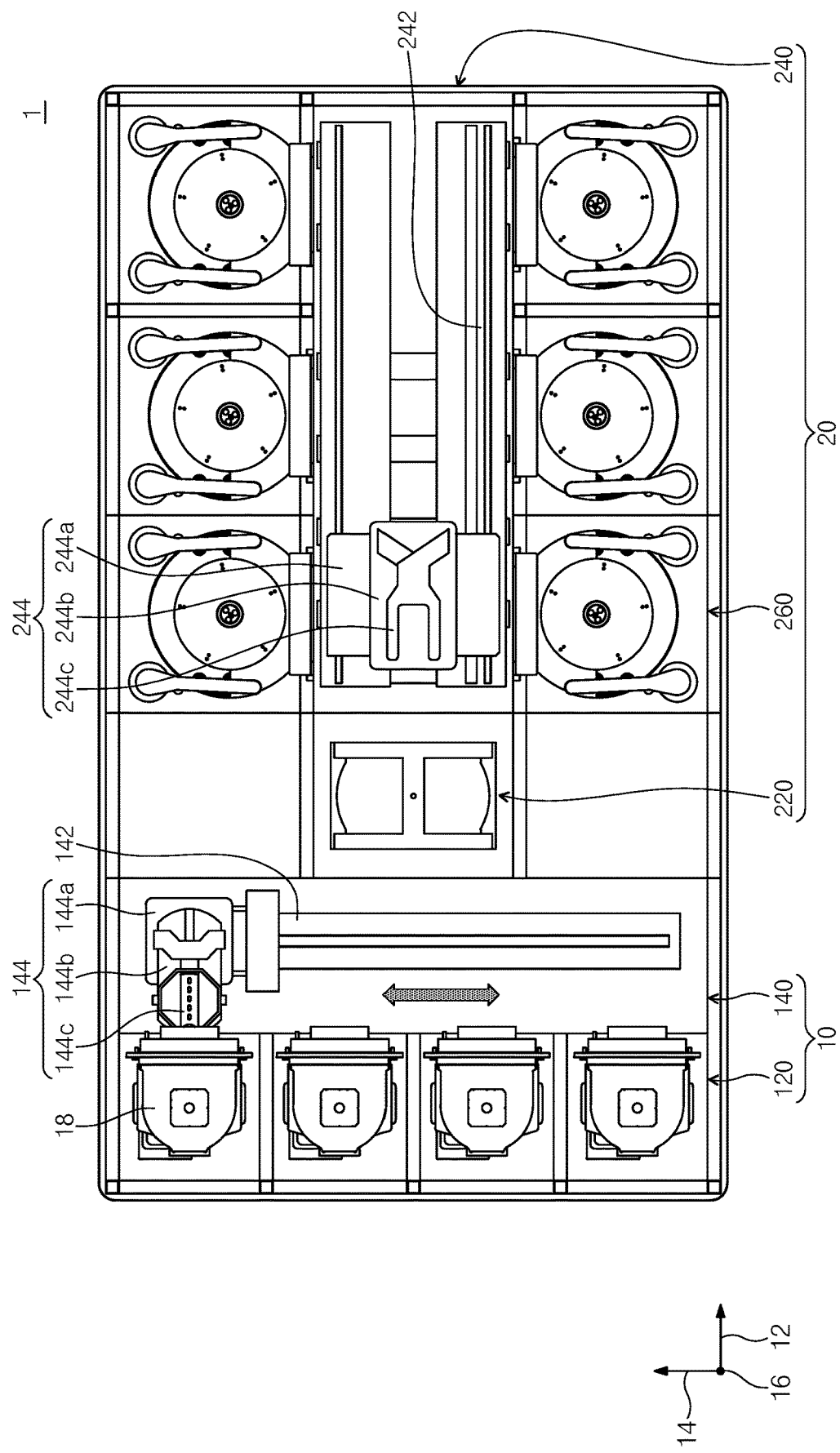
FIG. 3 is a plan view schematically illustrating a substrate treating system 1 according to the inventive concept.

FIG. 3 is a plan view schematically illustrating a substrate treating system 1 according to the inventive concept. Referring to FIG. 3, the substrate treating system 1 has an index module 10 and a process treating module 20, and the index module 10 has a plurality of load ports 120 and a feeding frame 140. The load ports 120, the feeding frame 140, and the process treating module 20 may be sequentially arranged in a row. Hereinafter, a direction in which the load port 120, the feeding frame 140, and the process treating module 20 will be referred to a first direction 12. A direction perpendicular to the first direction 12 when viewed from the top will be referred to as a second direction 14, and a direction normal to a plane including the first direction 12 and the second direction 14 will be referred to as a third direction 16.

Figure 1:
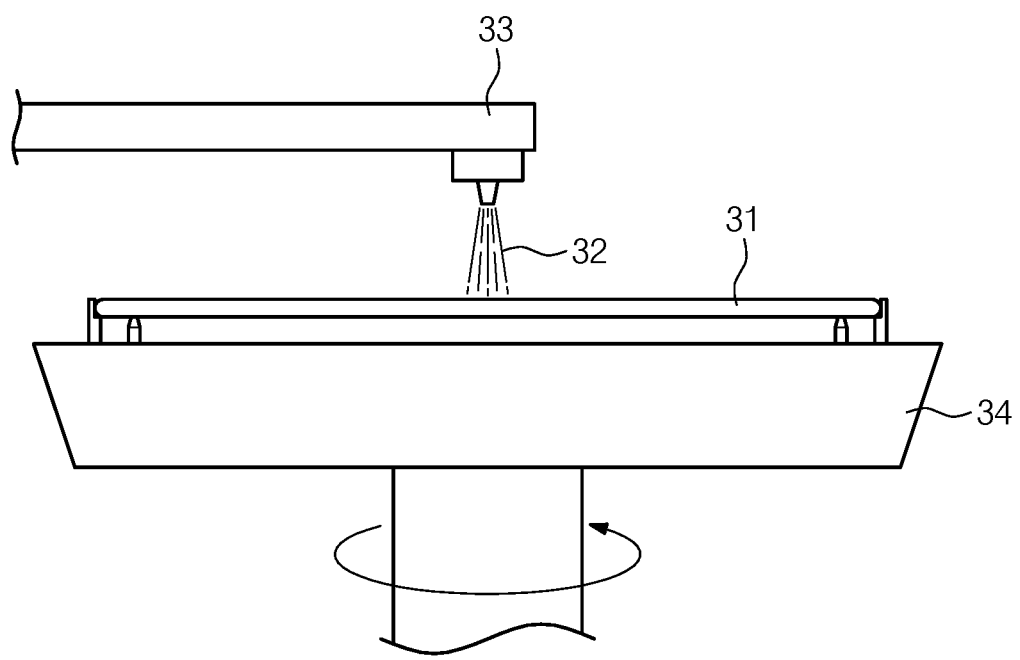
FIG. 1 is a view illustrating a supporting unit that supports a substrate and a liquid supply unit that supplies a liquid of a general substrate treating apparatus.
Figure 2:
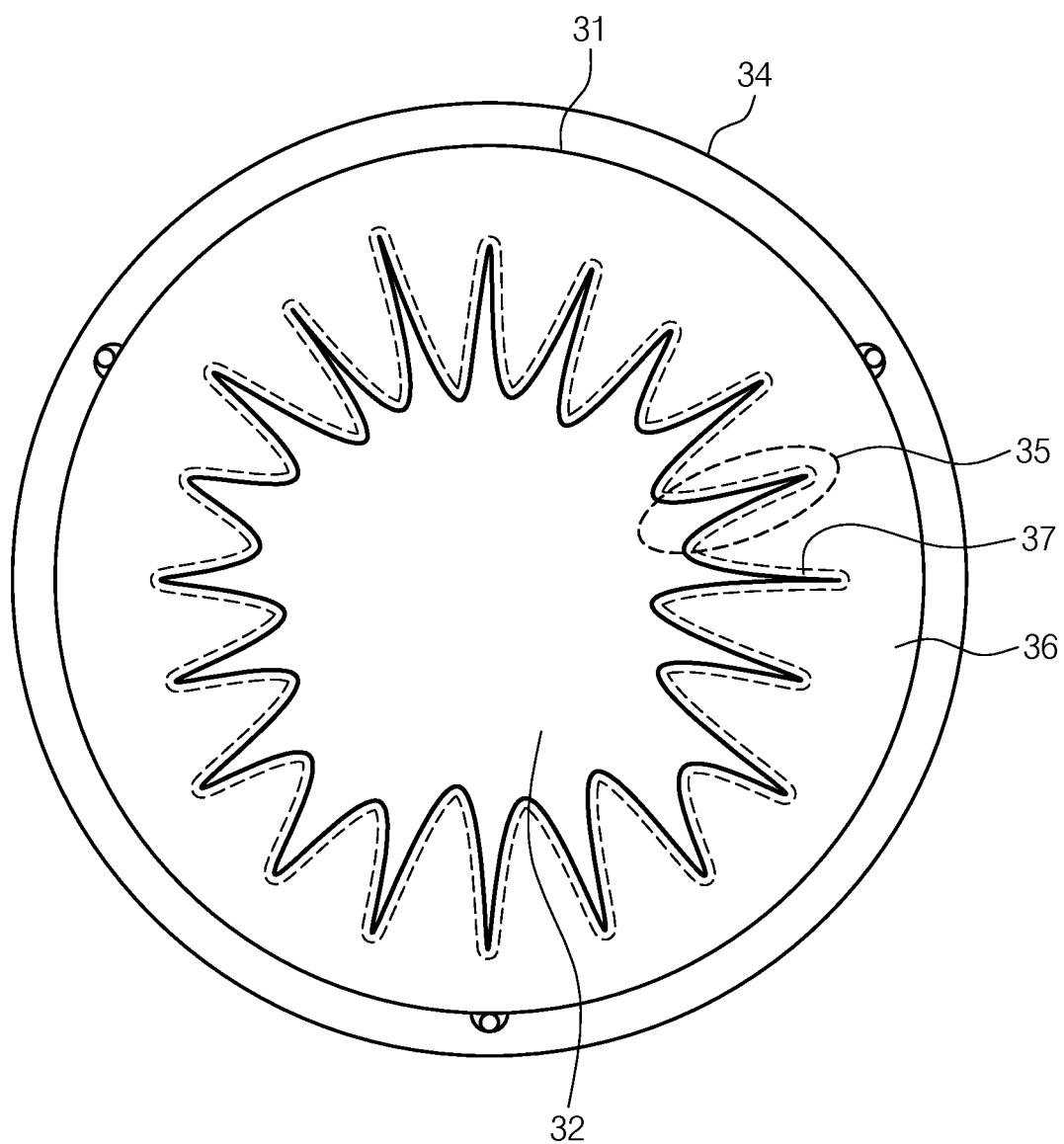
FIG. 2 is a view illustrating the substrate of FIG. 1, to which the liquid is supplied, when viewed from the top.

A carrier 18, in which a substrate W is received, is seated on the load port 120. A plurality of load ports 120 are provided, and are arranged along the second direction 14 in a row. FIG. 1 illustrates that four load ports 120 are provided. The number of the load ports 120 may be increased or decreased according to the process efficiency of the process treating module 20, a footprint condition, and the like. A plurality of slots (not illustrated) provided to support peripheries of substrates W are formed in the carrier 18. A plurality of slots are provided along the third direction 16, and the substrate W is situated in the carrier 130 such that the substrates W are stacked to be spaced apart from each other along the third direction 16. A front opening unified pod (FOUP) may be used as the carrier 18.

The process treating module 20 includes a buffer unit 220, a feeding chamber 240, and a plurality of process chambers 260. The feeding chamber 240 is arranged such that the lengthwise direction thereof is in parallel to the first direction 12. The process chambers 260 are arranged on opposite sides of the feeding chamber 240 along the second direction 14. The process chambers 260 situated on one side of the feeding chamber 240 and the process chambers 260 situated on an opposite side of the feeding chamber 240 are symmetrical to each other with respect to the feeding chamber 240. Some of the process chambers 260 are arranged along the lengthwise direction of the feeding chamber 240. Furthermore, some of the process chambers 260 are arranged to be stacked on each other. That is, the process chambers 260 having an array of A by B (A and B are natural numbers) may be arranged on one side of the feeding chamber 240. Here, A is the number of the process chambers 260 provided in a row along the first direction 12, and B is the number of the process chambers 260 provided in a row along the third direction 16. When four or six process chambers 260 are provided on one side of the feeding chamber 240, the process chambers 260 may be arranged in an array of 2 by 2 or 3 by 2. The number of the process chambers 260 may increase or decrease. Unlike the above-mentioned description, the process chambers 260 may be provided only on one side of the feeding chamber 240. Further, unlike the above-mentioned description, the process chambers 260 may be provided on one side or opposite sides of the feeding chamber 240 to form a single layer.

A buffer unit 220 is arranged between the feeding frame 140 and the feeding chamber 240. The buffer unit 220 provides a space in which the substrates W stay before being transported, between the feeding chamber 240 and the feeding frame 140. Slots (not illustrated) in which the substrates W are positioned are provided in the buffer unit 220, and a plurality of slots (not illustrated) are provided to be spaced apart from each other along the third direction 16. Faces of the buffer unit 220 that face the feeding frame 140 and face the feeding chamber 240 are opened.

The feeding frame 140 transports the substrates W between the carrier 18 seated on the load port 120 and the buffer unit 220. An index rail 142 and an index robot 144 are provided in the feeding frame 140. The index rail 142 is arranged such that the lengthwise direction thereof is in parallel to the second direction 14. The index robot 144 is installed on the index rail 142, and is linearly moved in the second direction 14 along the index rail 142. The index robot 144 has a base 144a, a body 144b, and a plurality of index arms 144c. The base 144a is installed to be moved along the index rail 142. The body 144b is coupled to the base 144a. The body 144b is provided to be moved along the third direction 16 on the base 144a. The body 144b is provided to be rotated on the base 144a. The index arms 144c are coupled to the body 144b, and are provided to be moved forwards and rearwards with respect to the body 144b. A plurality of index arms 144c are provided to be driven individually. The index arms 144c are arranged to be stacked so as to be spaced apart from each other along the third direction 16. Some of the index arms 144c are used when the substrates W are transported to the carrier 18 from the process treating module 20, and some of the index arms 144c may be used when the substrates W are transported from the carrier 18 to the process treating module 20. This structure may prevent particles generated from the substrates W before the process treatment from being attached to the substrates W after the process treatment in the process of carrying the substrates W in and out by the index robot 144.

The feeding chamber 240 transports the substrates W between the buffer unit 220 and the process chambers 260, and between the process chambers 260. A guide rail 242 and a main robot 244 are provided in the feeding chamber 240. The guide rail 242 is arranged such that the lengthwise direction thereof is in parallel to the first direction 12. The main robot 244 is installed on the guide rail 242, and is linearly moved along the first direction 12 on the index rail 242. The main robot 244 has a base 244a, a body 244b, and a plurality of main arms 244c. The base 244a is installed to be moved along the guide rail 242. The body 244b is coupled to the base 244a. The body 244b is provided to be moved along the third direction 16 on the base 244a. The body 244b is provided to be rotated on the base 244a. The main arms 244c are coupled to the body 244b, and are provided to be moved forwards and rearwards with respect to the body 244b. A plurality of main arms 244c are provided to be driven individually. The main arms 244c are arranged to be stacked so as to be spaced apart from each other along the third direction 16. The main arms 244c used when the substrates W are transported from the buffer unit 220 to the process chambers 260 and the main arms 244c used when the substrates W are transported from the process chambers 260 to the buffer unit 220 may be different.

Substrate treating apparatuses 300 that perform cleaning processes on the substrates W are provided in the process chambers 260. The substrate treating apparatuses 300 provided in the respective process chambers 260 may have different structures according to the types of performed cleaning processes. Selectively, the substrate treating apparatuses 300 in the respective process chambers 260 may have the same structure. Selectively, the process chambers 260 may be classified into a plurality of groups such that the substrate treating apparatuses 300 provided in the process chambers 260 pertaining to the same group have the same structure and the substrate treating apparatuses 300 provided in the process chambers 260 pertaining to different groups have different structures from each other. For example, when the process chambers 260 are classified into two groups, the first group of process chambers 260 may be provided on one side of the feeding chamber 240 and the second group of process chambers 260 may be provided on an opposite side of the feeding chamber 240. Selectively, the first group of process chambers 260 may be provided on the lower side of the feeding chamber 240 and the second group of process chambers 260 may be provided on the upper side of the feeding chamber 240, on opposite sides of the feeding chamber 240. The first group of process chambers 260 and the second group of process chambers 260 may be classified according to the kinds of the used chemicals or the types of cleaning methods.

Figure 4:
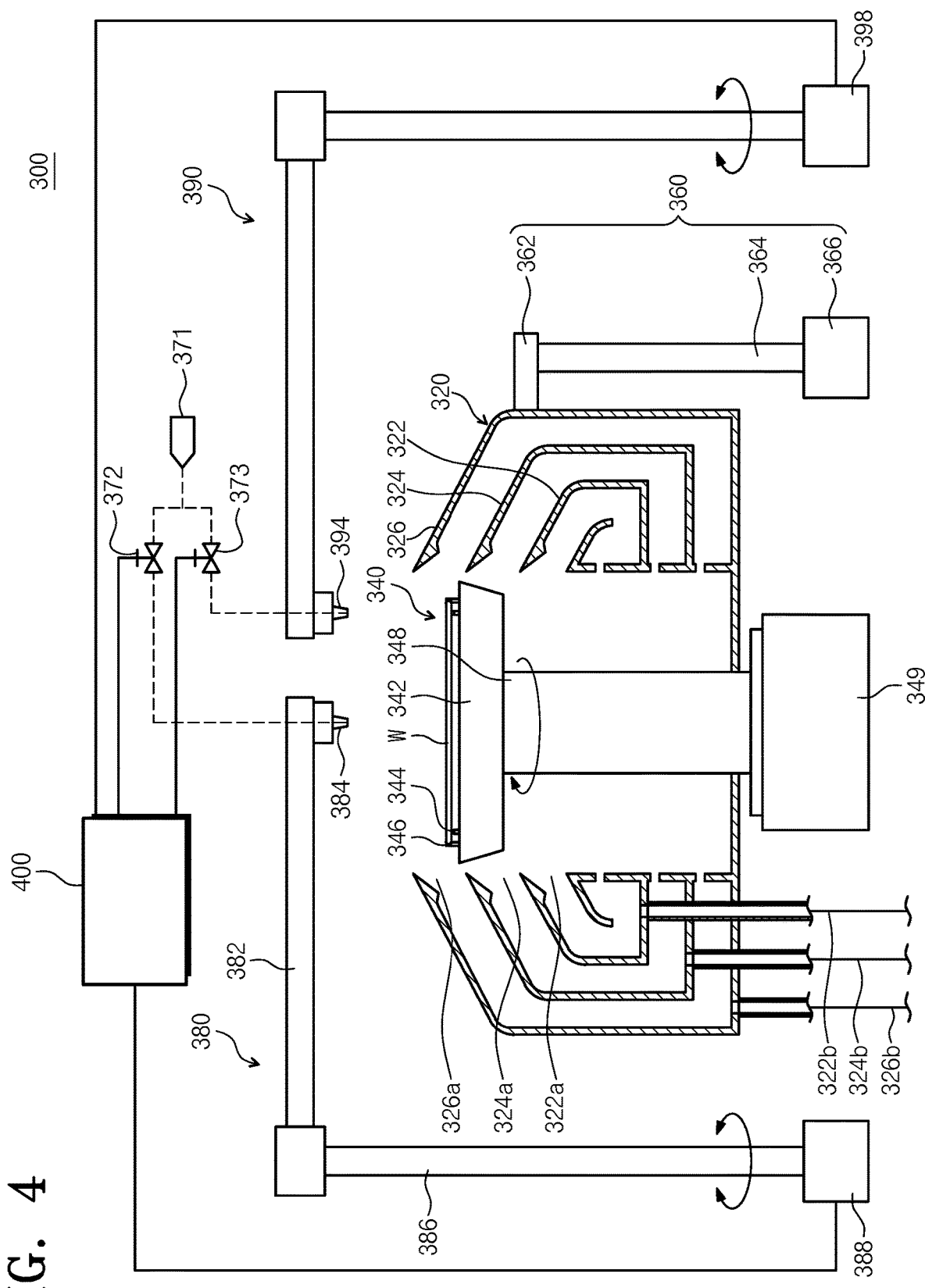
FIG. 4 is a sectional view illustrating an example of the substrate treating apparatus 300.

Hereinafter, an example of a substrate treating apparatus 300 that cleans a substrate W by using a treatment liquid will be described. FIG. 4 is a sectional view illustrating an example of the substrate treating apparatus 300. Referring to FIG. 4, the substrate treating apparatus 300 includes a housing 320, a support unit 340, an elevation unit 360, a first supply unit 380, a second supply unit 390, and a controller 400.

The housing 320 has a space for performing a substrate treating process in the interior thereof, and an upper side of the housing 320 is opened. The housing 320 has an inner recovery vessel 322, an intermediate recovery vessel 324, and an outer recovery vessel 326. The respective recovery vessels 322, 324, and 326 recover different treatment liquids used in the process. The inner recovery vessel 322 has an annular ring shape that surrounds the support unit 340, the intermediate recovery vessel 324 has an annular ring shape that surrounds the inner recovery vessel 322, and the outer recovery vessel has an annular ring shape that surrounds the intermediate recovery vessel 324. An inner space 322a of the inner recovery vessel 322, a space 324a between the inner recovery vessel 322 and the intermediate recovery vessel 324, and a space 326a between the intermediate recovery vessel 324 and the outer recovery vessel 326 function as inlets through which the treatment liquids are introduced into the inner recovery vessel 322, the intermediate recovery vessel 324, and the outer recovery vessel 326 respectively. Recovery lines 322b, 324b, and 326b extending from the recovery vessels 322, 324, and 326 perpendicularly in the downward direction of the bottom surfaces thereof are connected to the recovery vessels 322, 324, and 326, respectively. The recovery lines 322b, 324b, and 326b discharge the treatment liquids introduced through the recovery vessels 322, 324, 326, respectively. The discharged treatment liquids may be reused through an external treatment liquid recycling system (not illustrated).

The support unit 340 is arranged in the housing 320. The support unit 340 supports the substrate W. The support unit 340 may be provided as the spin head 340 that rotates the supported substrate W. According to an embodiment, the spin head 340 is arranged within the housing 320. The spin head 340 supports and rotates the substrate W during the process. The spin head 340 has a body 342, a plurality of support pins 334, a plurality of chuck pins 346, and a support shaft 348. The body 342 has an upper surface having a substantially circular shape when viewed from the top. The support shaft 348 that may be rotated by a motor 349 is fixedly coupled to the bottom of the body 342. A plurality of support pins 334 are provided. The support pins 334 may be arranged to be spaced apart from each other at a periphery of the upper surface of the body 342 and protrude upwards from the body 342. The support pins 334 are arranged to have a generally annular ring shape through combination thereof. The support pins 334 support a periphery of a rear surface of the substrate W such that the substrate W is spaced apart from the upper surface of the body 342 by a predetermined distance. A plurality of chuck pins 346 are provided. The chuck pins 346 are arranged to be more distant from the center of the body 342 than the support pins 334. The chuck pins 346 are provided to protrude upwards from the body 342. The chuck pins 346 support a side of the substrate W such that the substrate W is not separated laterally from a proper place when the spin head 340 is rotated. The chuck pins 346 are provided to be linearly moved between a standby position and a support position along a radial direction of the body 342. The standby position is a position that is more distant from the center of the body 342 than the support position. When the substrate W is loaded on or unloaded from the spin head 340, the chuck pins 346 are located at the standby position, and when a process is performed on the substrate W, the chuck pins 346 are located at the support position. The chuck pins 346 are in contact with the side of the substrate W at the support position.

The elevation unit 360 linearly moves the housing 320 upwards and downwards. When the housing 320 moves upwards and downwards, a relative height of the housing 320 to the spin head 340 is changed. The elevation unit 360 has a bracket 362, a movable shaft 364, and a driver 366. The bracket 362 is fixedly installed on an outer wall of the housing 320, and the movable shaft 364 that moves upwards and downwards by the driver 366 is fixedly coupled to the bracket 362. The housing 320 is lowered such that, when the substrate W is positioned on the spin head 340 or is lifted from the spin head 340, the housing 320 is lowered such that the spin head 340 protrudes to the upper side of the housing 320. When the process is performed, the height of the housing 320 is adjusted such that the treatment liquid are introduced into the preset recovery vessel 360 according to the kind of the treatment liquid supplied to the substrate W. For example, the substrate W is located at a height corresponding to an interior space 322a of the inner recovery vessel 322 while the substrate W is treated by a first treatment fluid. Further, the substrate W may be located at a height corresponding to a space 324a between the inner recovery vessel 322 and the intermediate recovery vessel 324 and a space 326a between the intermediate recovery vessel 324 and the outer recovery vessel 326 while the substrate W is treated by a second treatment liquid and a third treatment liquid respectively. Unlike those described above, the elevation unit 360 may move the spin head 340, instead of the housing 320, upwards and downwards.

The first supply unit 380 has a first nozzle 384 that supplies a treatment liquid onto the substrate W positioned on the spin head 340. For example, the first supply unit 380 has a nozzle support 382, a first nozzle 384, a support shaft 386, and a driver 388.

The lengthwise direction of the support shaft 386 is provided along the third direction 16, and the driver 388 is coupled to a lower end of the support shaft 386. The driver 388 rotates and elevates the support shaft 386. The nozzle support 382 is coupled to an end of the support shaft 386, which is opposite to an end of the support shaft 386 coupled to the driver 388, perpendicularly to the support shaft 386. The first nozzle 384 is installed on a bottom surface of an end of the nozzle support 382. The first nozzle 384 moves to a process location and a standby location by the driver 388. The process location is a location at which the first nozzle 384 is arranged at a vertical upper portion of the housing 320, and the standby location is a location that deviates from the vertical upper portion of the housing 320.

The first nozzle 384 supplies a treatment liquid to an area including a central area on the substrate W positioned on the spin head 340. A storage container 371 that stores the treatment liquid is connected to the first nozzle 384 through a supply line. A valve 372 is installed in the supply line.

The second supply unit 390 has a second nozzle 394 that supplies a treatment liquid onto the substrate W positioned on the spin head 340. The second nozzle 394 supplies a treatment liquid to a peripheral area of the substrate W positioned on the spin head 340. A storage container 371 that stores the treatment liquid is connected to the second nozzle 394 through a supply line. A valve 373 is installed in the supply line. The second supply unit 390 has a driver 398 to change a treatment liquid supply point of the second nozzle 394. The other configurations and structures of the second supply unit 390 are similar to those of the first supply unit 380. The treatment liquids supplied through the first nozzle 384 and the second nozzle 394 may be the same. The treatment liquid may be an organic solvent such as isopropyl alcohol (IPA).

The controller 400 controls the valves 372 and 373 connected respectively to the first nozzle 384 and the second nozzle 394 and the drivers 388 and 398 to determine whether the liquid is discharged through the first nozzle 384 and the second nozzle 394 and adjust the supply points of the first nozzle 384 and the second nozzle 394 on the substrate W. Hereinafter, a method for treating the substrate W by controlling the first nozzle 384 and the second nozzle 394 by the controller 400 to supply the treatment liquid to the substrate W supported by the spin head 340 will be described in detail.

Hereinafter, the method for treating a substrate according to the embodiment of the inventive concept by using the above-mentioned substrate treating apparatus will be described for convenience of description.

Figure 5:
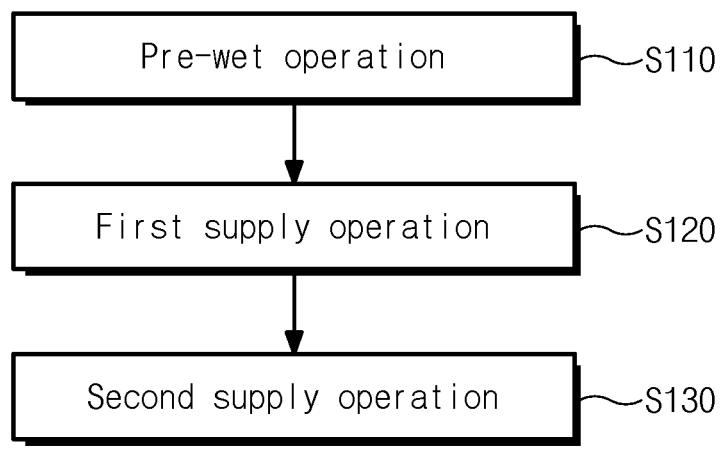
FIG. 5 is a flowchart illustrating a method for treating a substrate according to an embodiment of the inventive concept.

FIG. 5 is a flowchart illustrating a method for treating a substrate according to an embodiment of the inventive concept. Referring to FIGS. 4 and 5, the treatment liquid is supplied onto a rotating substrate by using the first nozzle 384 and the second nozzle 394 to treat the substrate. The substrate treating method includes a pre-wet operation S110, a first supply operation S120, and a second supply operation S130. According to an embodiment, the controller 400 controls the valves 372 and 373 and the drivers 388 and 398 to sequentially perform the first supply operation S120 and the second supply operation S130.

The pre-wet operation S110 is selectively performed if necessary before the first supply operation S120. In the pre-wet operation S110, a pre-wet liquid is supplied onto the substrate W positioned on the spin head 340. According to an embodiment, the pre-wet liquid may be pure water (DIW). Optionally, the pre-wet operation S110 may not be performed.

FIGS. 6 to 10 are views sequentially illustrating the method for treating a substrate according to an embodiment.

Figure 6:
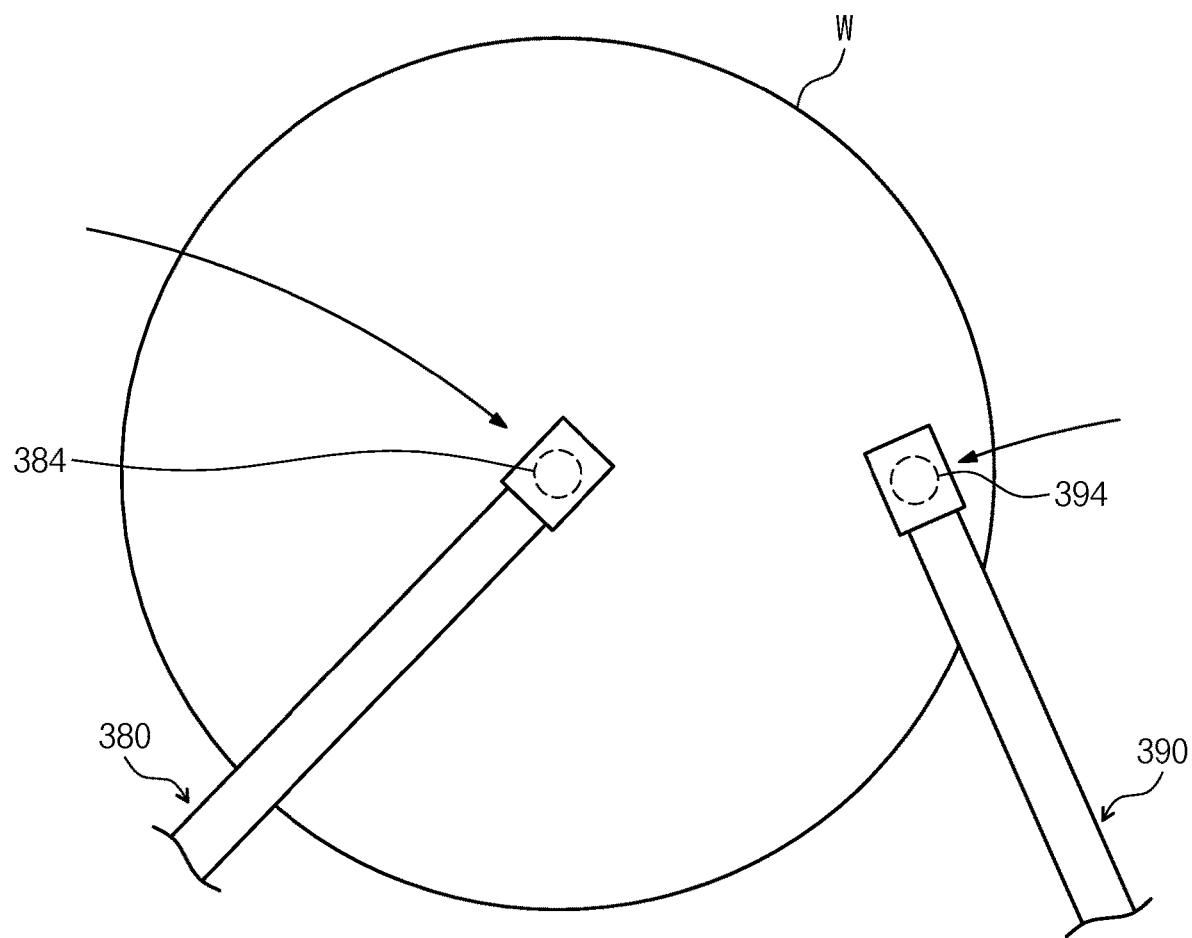
FIGS. 6 to 10 are views sequentially illustrating the method for treating a substrate according to an embodiment.

FIG. 6 is a view illustrating that the first nozzle 384 and the second nozzle 394 move to perform the first supply operation S120. Referring to FIG. 6, in a preparation operation, the controller 400 controls the drivers 388 and 398 such that the first nozzle 384 and the second nozzle 394 are located to initial locations at which the treatment liquid may be supplied onto the substrate. For example, the controller 400 controls the drivers 388 and 398 such that the first nozzle 384 is located at a location at which the treatment liquid may be discharged to a central area of the substrate W and the second nozzle 394 is located at a location at which the treatment liquid may be discharged to a peripheral area of the substrate W.

Figure 7:
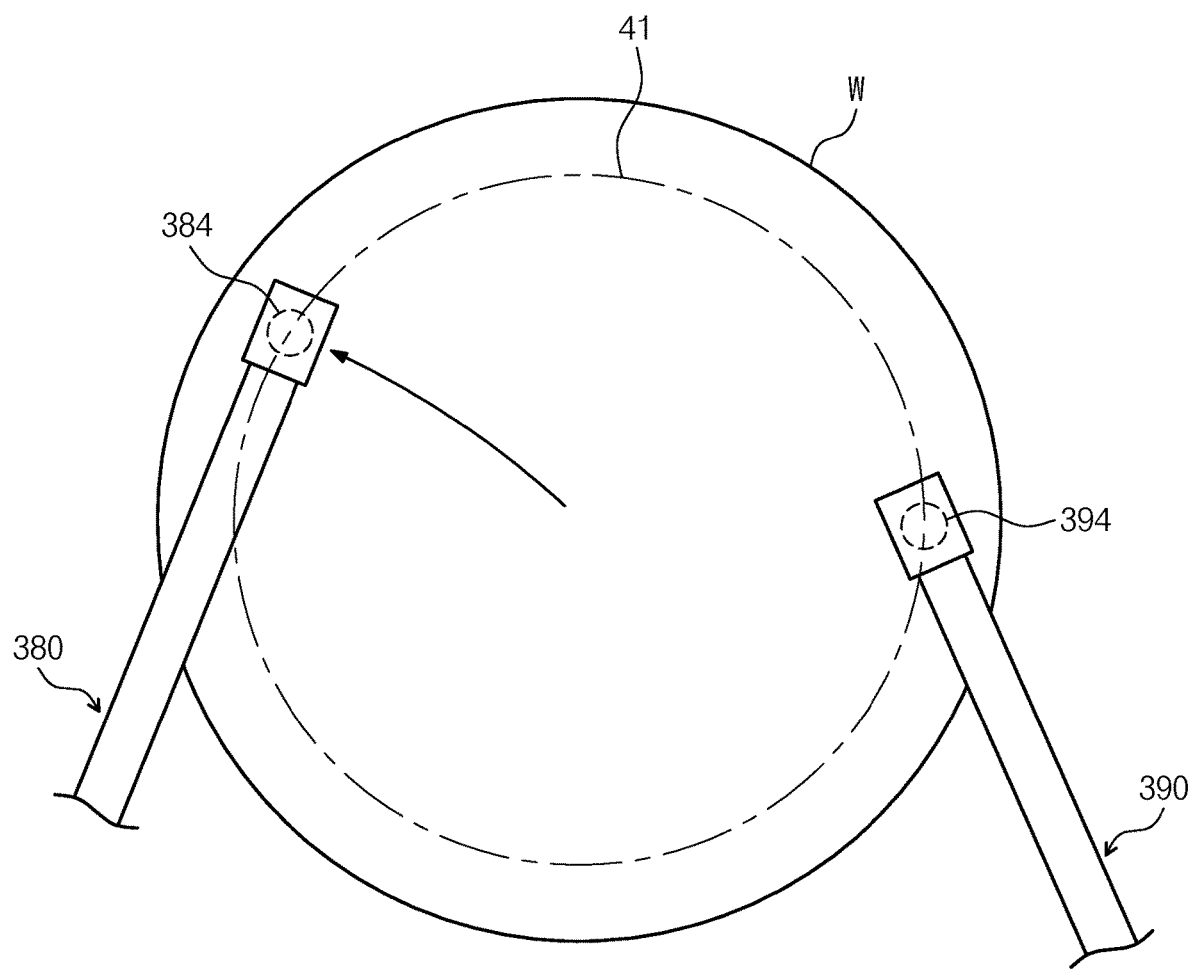

FIG. 7 is a view illustrating a first supply operation S120. Referring to FIG. 7, in the first supply operation S120, the treatment liquid is supplied to the substrate W positioned on the spin head 340 by using the first nozzle 384, and the treatment liquid is supplied to the substrate W positioned on the spin head 340 by using the second nozzle 394 at the same time. According to an embodiment, the controller 400 controls the valve 372 and the driver 388 such that a first supply point that is a supply point of the treatment liquid supplied from the first nozzle 384 on the substrate moves between the central area and the peripheral area of the substrate W to be supplied with the treatment liquid during the first supply operation S120. For example, as illustrated in FIG. 7, the first supply operation S120 is performed while the treatment liquid is supplied while the first supply point moves from the center of the substrate W to a first location 41 once as the first nozzle 384 controlled by the controller 400 moves. At the same time, the controller 400 controls the driver 398 such that a second supply point that is a supply point of the treatment liquid supplied from the second nozzle 394 is fixed to the first location 41 of the peripheral area of the substrate W during the first supply operation S120. The substrate W may be a wafer having a radius of 300 mm, and the first location 41 may be a location that is spaced apart from the center of the wafer by 140 mm.

Figure 8:
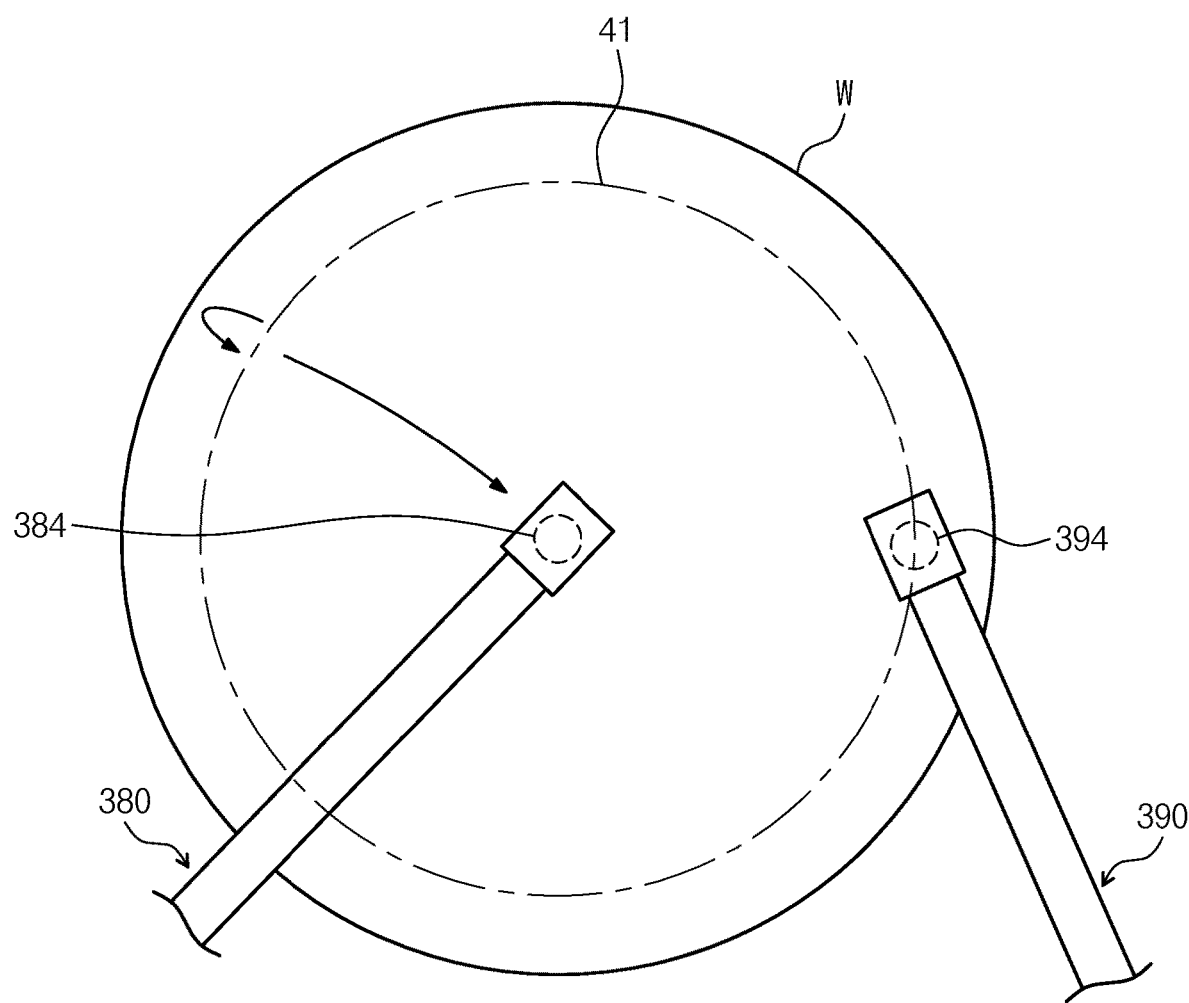
Figure 9:
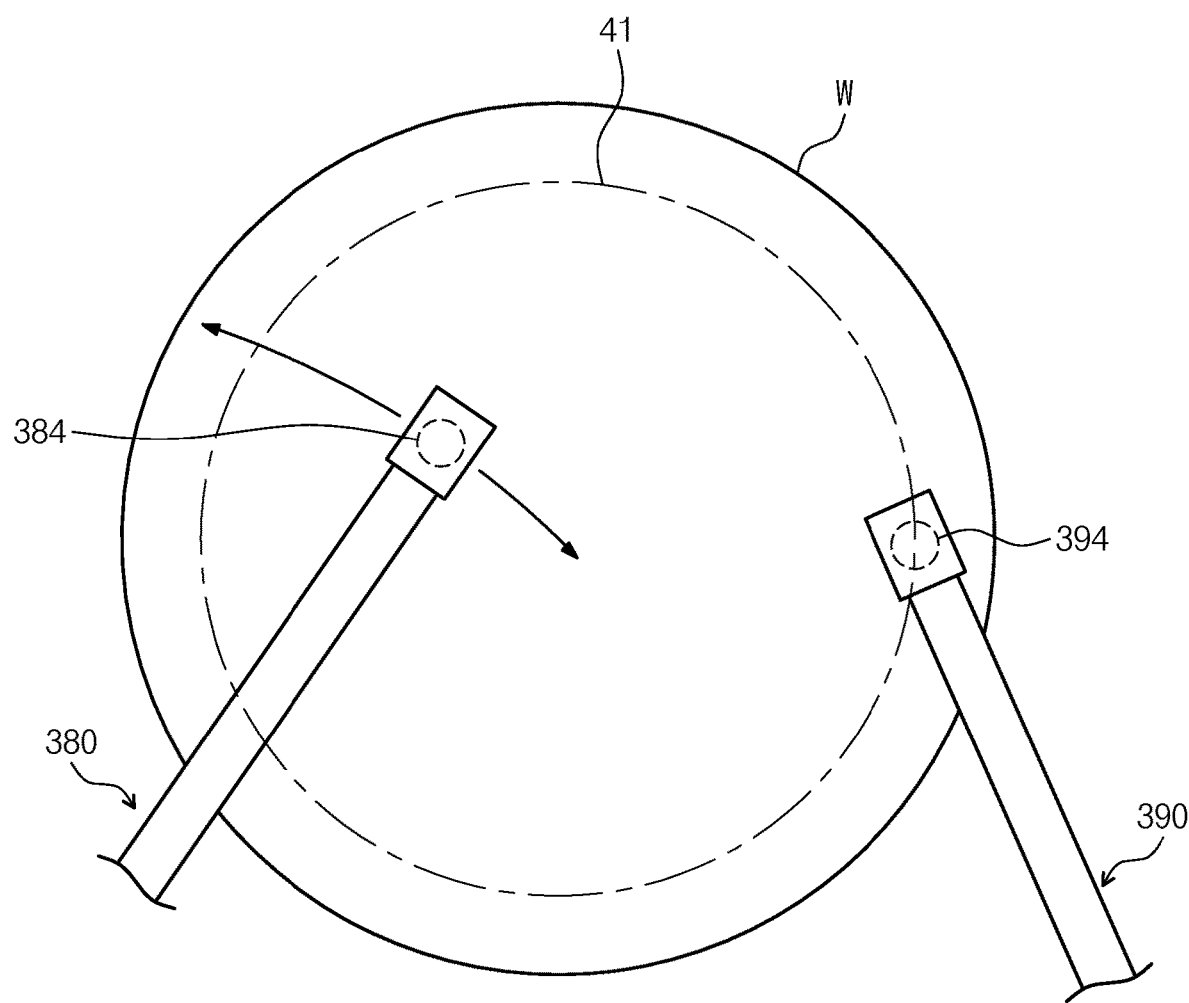
Figure 10:
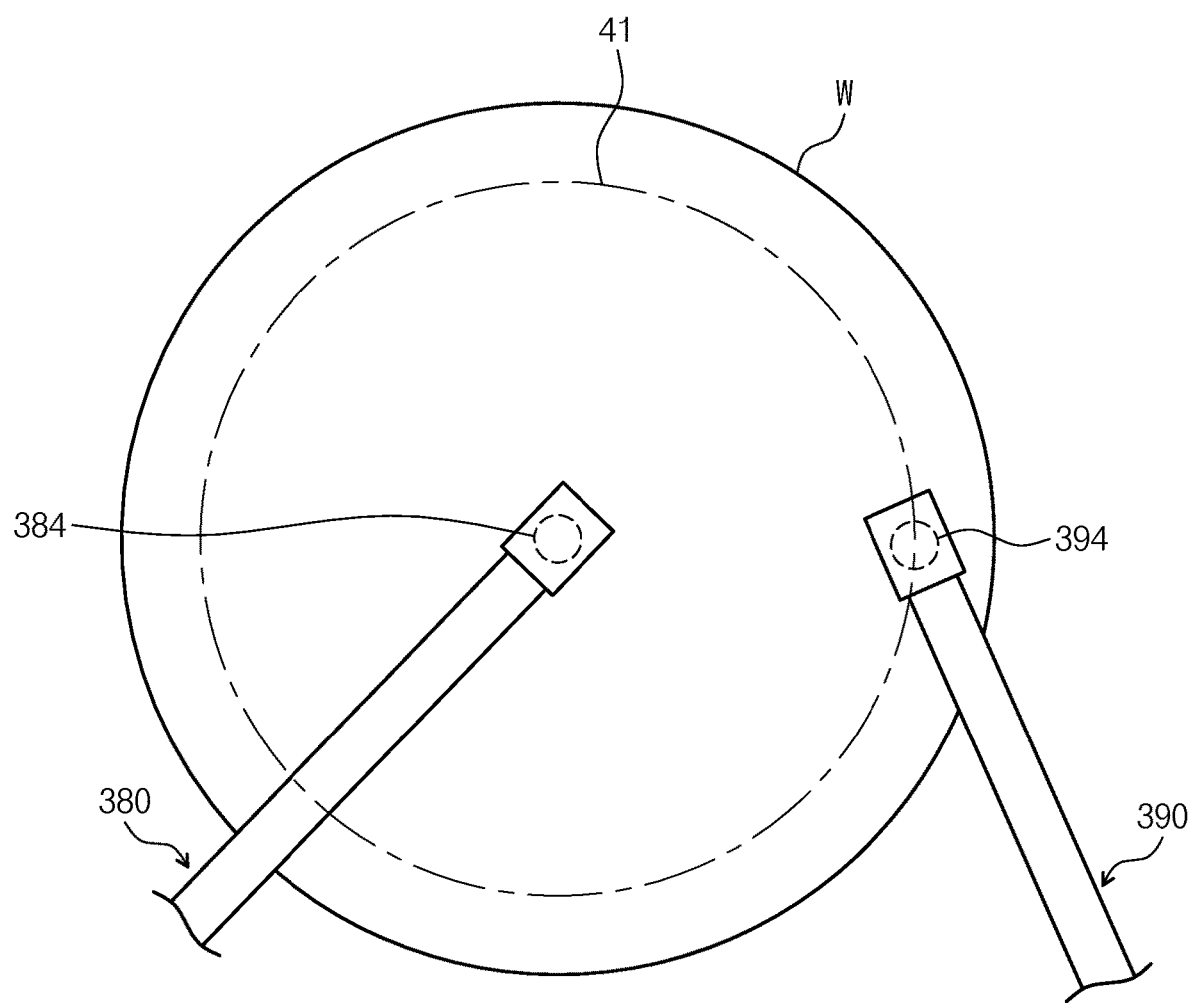

FIGS. 8 to 10 are views sequentially illustrating a second supply operation S130.

In the second supply operation S130, the first nozzle 384 supplies the treatment liquid and the second nozzle 394 stops supplying the treatment liquid. Referring to FIG. 8, the controller 400 controls the valve 372 and the driver 388 such that the first nozzle 384 supplies the treatment liquid while moving the first supply point. For example, the controller 400 controls the valve 372 and the driver 388 such that, after the treatment liquid is supplied while the first supply point moves from the first location 41 that is a final location in the first supply operation S120 to an end of the substrate W, the treatment liquid is supplied while the first supply point moves to the center of the substrate W.

Referring to FIG. 9, thereafter, the controller 400 controls the valve 372 and the driver 388 such that the first supply point moves between the peripheral area of the substrate W and the central area of the substrate W several times. For example, the controller 400 controls the valve 372 and the driver 388 such that the first supply point moves between an end of the substrate W and the center of the substrate W several times.

Referring to FIG. 10, thereafter, the controller 400 controls the valve 372 and the driver 388 such that the treatment liquid may be supplied while the first supply point is fixed to the central area of the substrate W. For example, in this case, the first supply point may be the center of the substrate W.

Although FIGS. 8 to 10 illustrates a state in which the second supply point of the second nozzle 394 is fixed to the first location during the second supply operation S130 in which the second nozzle 394 does not discharge the treatment liquid, optionally, the second nozzle 394 may be located to deviate from a location that faces the substrate W supported by the spin head 340 when viewed from the top during the second supply operation S130.

During the first supply operation S120 and the second supply operation S130, the substrate W supported by the spin head 340 may be rotated at 100 to 800 rpms. In this case, a time period for which the first supply point and the second supply point move from the central area of the substrate W to the peripheral area of the substrate W once and a time period for which the first supply point and the second supply point move from the peripheral area of the substrate W to the central area of the substrate W once may be 1.0 to 1.2 seconds. The rotational speed of the substrate W and the movement speed of the first supply point may be set differently from the above-description. When the rotational speed of the substrate W is less than 100 rpms, the movement time of the substrate W may be set to less than 1.0 seconds. Further, when the rotational speed of the substrate W exceeds 800 rpms, the movement time of the substrate W may be set to more than 1.2 seconds.

Figure 11:
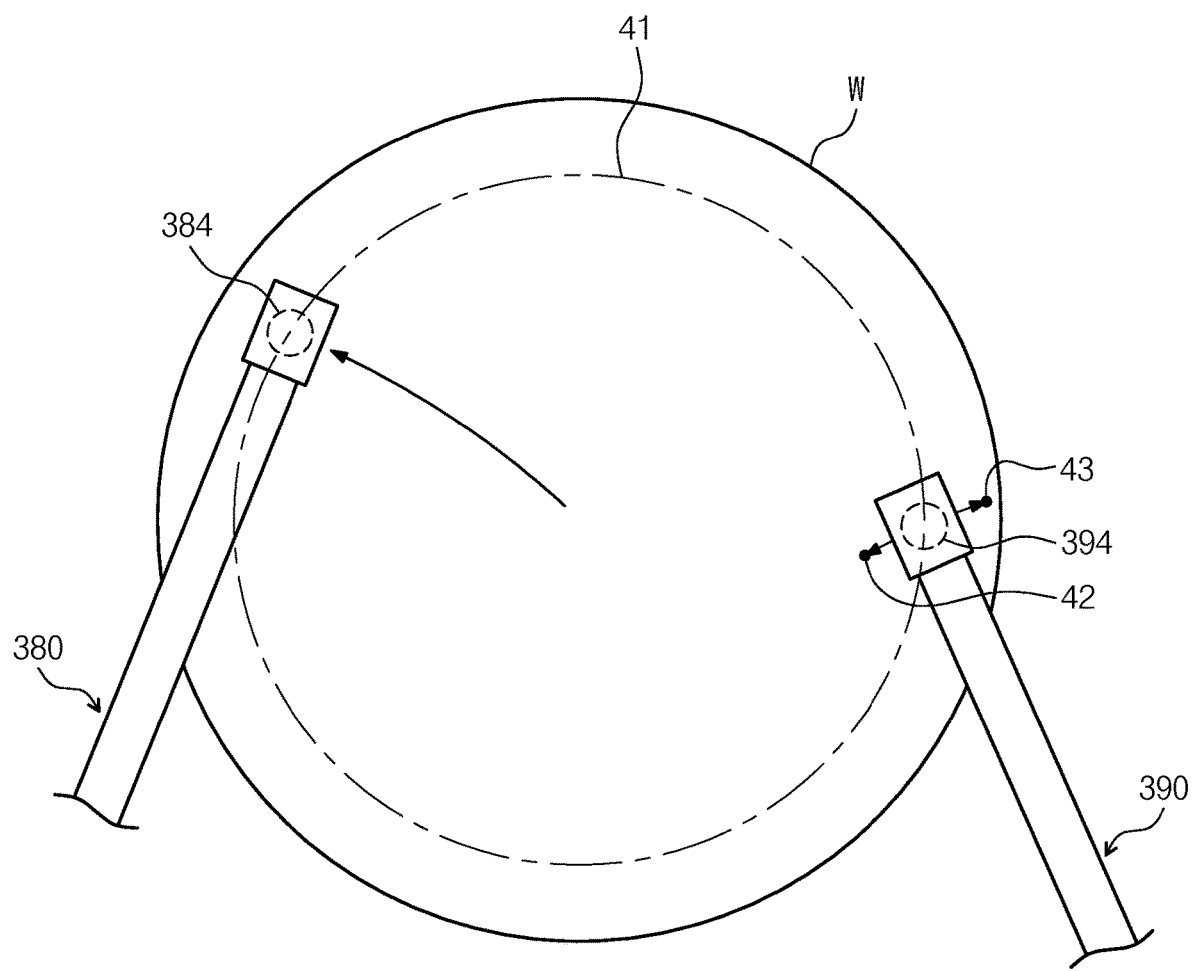
FIG. 11 is a view illustrating a first supply operation according to another embodiment.

FIG. 11 is a view illustrating a first supply operation S120 according to another embodiment. Referring to FIG. 11, unlike FIG. 7, during the first supply operation S120, optionally, the controller 400 controls the valve 373 and the driver 398 such that the treatment liquid may be supplied while the second supply point moves between the second location 42 and the third location 43 of the peripheral area of the substrate W. The second location 42 is a location that is closer to the central area of the substrate W than the third location 43. For example, the second location 42 is a location that is closer to the central area of the substrate W than the first location 41, and the third location 43 is a location that is closer to an end of the substrate W than the first location 41.

Figure 12:
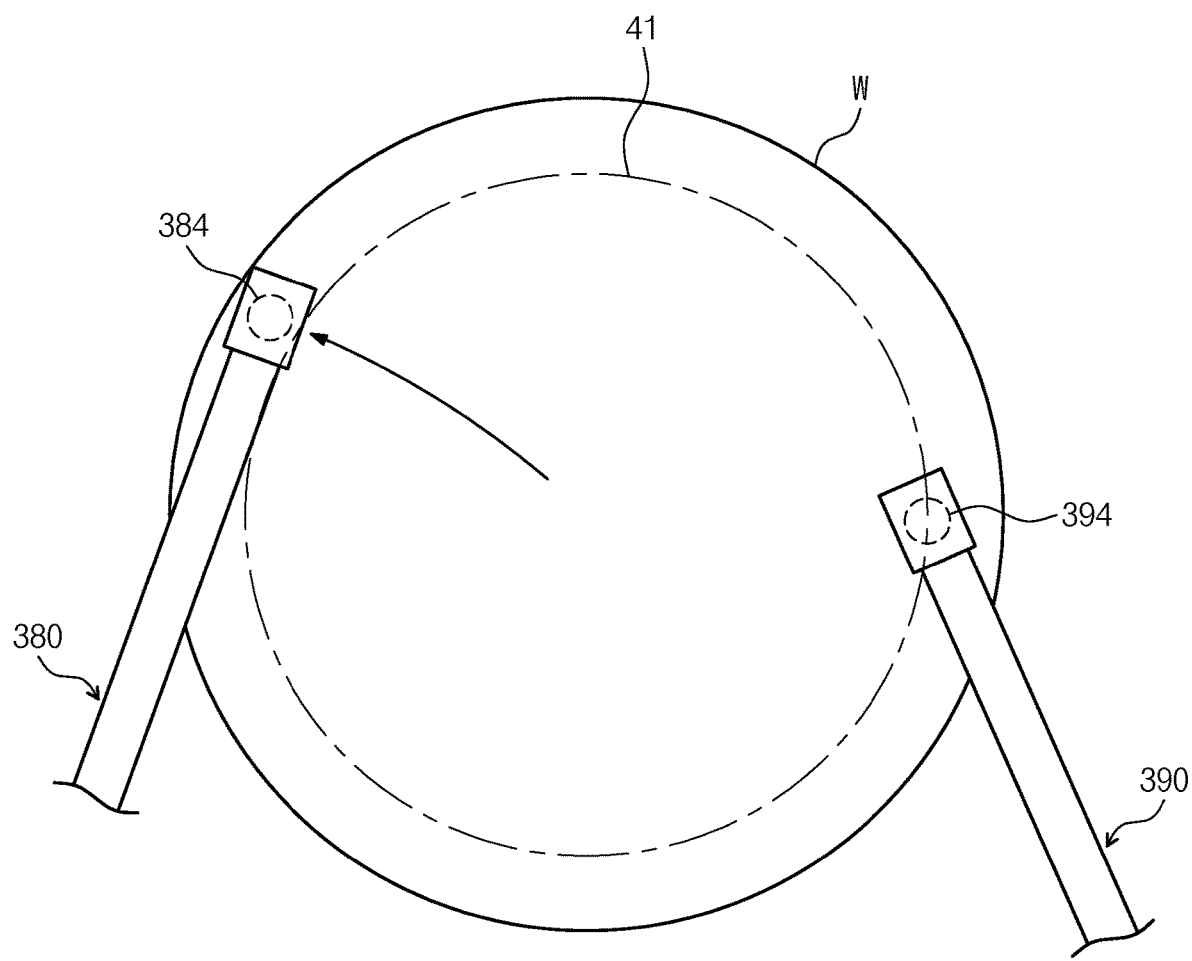
FIGS. 12 and 13 are views illustrating a first supply operation according to other embodiments respectively.
Figure 13:
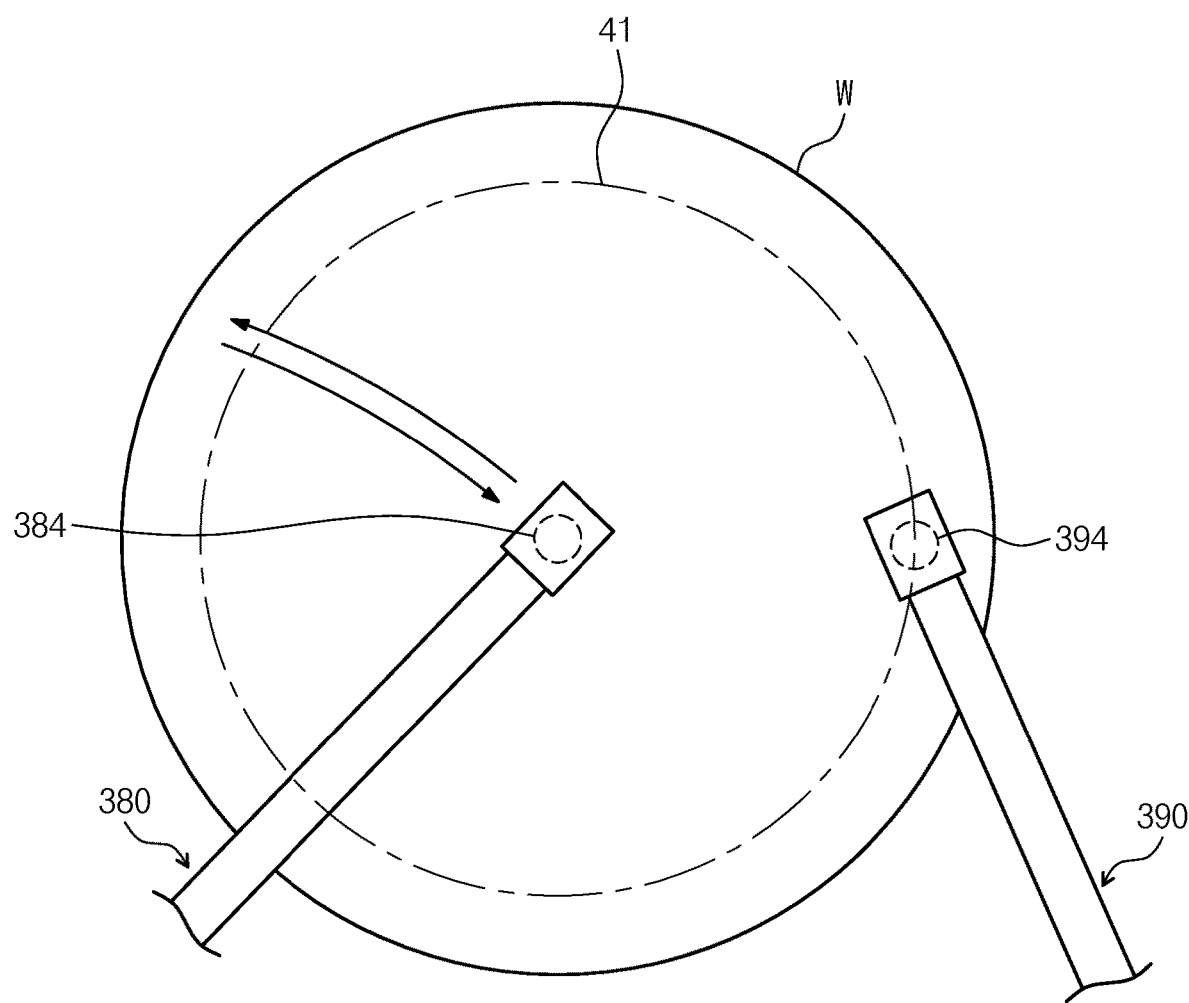

FIGS. 12 and 13 are views illustrating a first supply operation S120 according to other embodiments respectively.

Referring to FIG. 12, unlike FIG. 7, the first supply operation S120 is performed while the first supply point moves from the central area of the substrate W to the peripheral area of the substrate W once. For example, the controller 400 controls the valve 372 and the driver 388 such that the treatment liquid may be supplied while the first supply point moves between the center of the substrate W and an end of the substrate W once during the first supply operation S120. Thereafter, the second supply operation S130 is performed as in FIGS. 9 and 10.

Referring to FIG. 13, unlike FIGS. 7 and 12, the first supply operation is performed while the first supply point reciprocates between the central area of the substrate W and the peripheral area of the substrate W once. For example, the controller 400 controls the valve 372 and the driver 388 such that the treatment liquid may be supplied while the first supply point reciprocates between the center of the substrate W and an end of the substrate W once during the first supply operation S120. Thereafter, the second supply operation S130 is performed as in FIGS. 9 and 10.

Unlike FIGS. 7, 12, and 13, the movement of the first supply point in the first supply operation S120 allows the treatment liquid to be supplied while the first supply point moves between various locations and/or various numbers of times.

As mentioned above, the inventive concept may prevent contamination of the substrate due to particles and a leaning phenomenon due to the substrate drying phenomenon by providing the second nozzle 394 that discharges the treatment liquid to the peripheral area of the substrate in addition to the first nozzle 384 to shorten a time period for which the treatment liquid is applied to the whole substrate W when the liquid is supplied and minimize a time for generation of the drying area of the substrate.

According to the embodiments of the inventive concept, a time for generation of a drying area of the substrate may be minimized when the liquid is supplied.

Further, according to the embodiments of the inventive concept, contamination of the substrate due to particles may be prevented.

Further, according to the embodiments of the inventive concept, leaning of the substrate due to particles may be prevented.

What is claimed is:

1. A method for treating a substrate, wherein the substrate is treated by supplying a treatment liquid onto the rotating substrate by using a first nozzle and a second nozzle, wherein the first nozzle supplies the treatment liquid to an area including a central area on the substrate, and wherein the second nozzle supplies the treatment liquid to a peripheral area of the substrate, the method comprising a first supply operation of supplying the treatment liquid onto the substrate by using the first nozzle and supplying the treatment liquid to the peripheral area by using the second nozzle at the same time; and thereafter, a second supply operation of supplying the treatment liquid by using the first nozzle and stopping supply of the treatment liquid by using the second nozzle;

wherein in the first supply operation, the first nozzle supplies the treatment liquid while moving a first supply point that is a supply point of the treatment liquid supplied from the first nozzle on the substrate, wherein in the first supply operation, the second nozzle supplies the treatment liquid while a second supply point that is a supply point of the treatment liquid supplied from the second nozzle on the substrate moves only between a second location and a third location of the peripheral area, wherein the second location is a location that is closer to the central area of the substrate than the third location, wherein in the first supply operation, the first nozzle supplies the treatment liquid while the first supply point moves between the central area and the peripheral area of the substrate, and wherein in the second supply operation, immediately after the first supply operation is performed, the first nozzle supplies the treatment liquid while the first supply point moves from a first location of the peripheral area to an end of the substrate.

2. The method of claim 1, wherein the first supply operation is performed while the treatment liquid is supplied while the first supply point moves from a center of the substrate to the first location of the peripheral area once.

3. The method of claim 1, wherein the first supply operation is performed while the first supply point moves from the central area to the peripheral area once.

4. The method of claim 1, wherein the first supply operation is performed while the first supply point reciprocates between the central area and the peripheral area once.

5. The method of claim 1, wherein in the second supply operation, the first nozzle discharges the treatment liquid while the first supply point is fixed to the central area after the treatment liquid is supplied while the first supply point is moved.

6. The method of claim 1, further comprising:
before the first supply operation, a pre-wet operation of supplying a pre-wet liquid onto the substrate.

7. The method of claim 1, wherein the pre-wet liquid is pure water (DIW).

8. The method of claim 1, wherein in the first supply operation and the second supply operation, the substrate is rotated at 200 to 800 rpms.

9. The method of claim 1, wherein in the first supply operation and the second supply operation, a time period for which the first supply point moves from the central area to the peripheral area once and a time period for which the first supply point moves from the peripheral area to the central area once are 1.0 to 1.2 seconds.

10. The method of claim 1, wherein the treatment liquid is an organic solvent.

11. The method of claim 10, wherein the organic solvent includes isopropyl alcohol (IPA).

12. The method of claim 1, wherein the substrate is a wafer having a diameter of 300 mm, and
wherein the first location is a location that is spaced apart from the center of the wafer by 140 mm.

* * * * *